United States Patent [19]
Pfiester et al.

[11] Patent Number: 5,268,590
[45] Date of Patent: Dec. 7, 1993

[54] CMOS DEVICE AND PROCESS

[75] Inventors: James R. Pfiester; Thomas C. Mele; Young Limb, all of Austin, Tex.

[73] Assignee: Motorola, Inc., Schaumburg, Ill.

[21] Appl. No.: 958,583

[22] Filed: Oct. 8, 1992

Related U.S. Application Data

[63] Continuation of Ser. No. 457,649, Dec. 27, 1989, abandoned.

[51] Int. Cl.⁵ .......................................... H01L 27/02
[52] U.S. Cl. ................................. 257/764; 257/371; 257/377; 257/384; 257/412; 257/741; 257/751; 257/754; 257/915
[58] Field of Search .............................. 357/42, 52, 71; 257/371, 377, 384, 412, 741, 751, 764, 754, 915

[56] References Cited

U.S. PATENT DOCUMENTS 4,920,073 4/1990 Wei et al. ............................ 357/71
4,923,822 5/1990 Wang et al. .......................... 357/52

*Primary Examiner*—Edward Wojciechowicz
*Attorney, Agent, or Firm*—Jasper W. Dockrey

[57] ABSTRACT

A CMOS device and a method for its fabrication are disclosed. In one embodiment the CMOS device includes an NMOS transistor and a PMOS transistor each of which has silicided source and drain regions and a silicon gate electrode which includes a titanium nitride barrier layer. The NMOS transistor and PMOS transistors are coupled together by a silicon layer which is capped by a layer of titanium nitride barrier material. The source and drain regions are silicided with cobalt or other metal silicide which is prevented from reacting with the silicon gate electrode and interconnect by the presence of the titanium nitride barrier layer.

13 Claims, 2 Drawing Sheets

000
CMOS DEVICE AND PROCESS

This application is a continuation of prior application Ser. No. 07/457,649, filed Dec. 27, 1989, now abandoned.

BACKGROUND OF THE INVENTION

This invention relates generally to a CMOS device and to a method for the fabrication of CMOS devices, and more specifically to a silicided CMOS device and to a process for its fabrication.

In the fabrication of many CMOS integrated circuits, polycrystalline or amorphous silicon is used both as a gate electrode and as a material for interconnecting various devices which are combined to implement the integrated circuit function. The polycrystalline silicon is heavily doped with conductivity determining impurities to increase the conductivity of the material and thereby to increase the speed of the circuit, to increase the transconductance of individual transistors, and to otherwise improve the circuit performance. Thin, heavily doped silicon layers, however, still have an appreciable resistivity which must be overcome to achieve optimum circuit speed. The resistivity of the thin silicon layer can be reduced to an acceptable level by forming a silicide layer on the silicon. A silicide layer at the point of contact to the semiconductor substrate can also improve the contact resistance between a substrate region and an interconnecting means. Providing a silicide layer on the thin layer of silicon, however, can introduce an unacceptable shift in an important device parameter. To understand this it must be noted that the threshold voltage of a silicon gate MOS transistor is dependant upon the impurity doping level in the silicon gate electrode because this doping level determines the work function between the gate electrode and the underlaying substrate. It is usual to dope the gate electrode of P channel MOS transistors with a P type dopant and the gate electrode of N channel transistors with an N type dopant. The gate electrodes of N channel and P channel transistors are often connected together by a patterned portion of the same thin silicon layer from which the gate electrodes are fabricated. This interconnection between gate electrodes of different devices is a normal part of the interconnection of devices to implement the intended circuit function. It has been found that the diffusion of dopant impurities is significantly accelerated in silicon layers which have been silicided. As a result, the dopant impurities diffuse rapidly through the silicided silicon layers with the deleterious result that the gate electrodes of P channel transistors become doped with the rapidly migrating N type dopant impurities and vice versa for N channel transistors. This changes the threshold voltage, for example, of the P channel transistors to an unacceptably high value.

A need therefore existed for a method to lower the resistivity of silicon gate electrodes and interconnections and to provide silicided contacts to source and drain regions without causing undesirable shifts in threshold voltage.

It is therefore an object of this invention to provide an improved process for the fabrication of silicon gate CMOS devices.

It is another object of this invention to provide an improved process for the fabrication of silicon gate CMOS devices having low resistivity gate electrodes and interconnections and having silicided contacts to source and drain regions.

It is yet another object of this invention to provide improved silicon gate CMOS devices.

It is a still further object of this invention to provide improved silicon gate CMOS devices having highly conductive gate electrodes and interconnections and having silicided contacts to source and drain regions.

BRIEF SUMMARY OF THE INVENTION

The foregoing and other objects and advantages of the invention are achieved by a device and a method for its fabrication in which an electrically conductive barrier layer is formed on a silicon gate electrode before the formation of a metal silicide on the source and drain regions. In accordance with one embodiment of the invention, a CMOS device is provided which includes a first P channel MOS transistor having first source and drain regions which are contacted by a metal silicide and a first silicon gate electrode which includes a layer of titanium nitride. The device further includes a second N channel MOS transistor which also has source and drain regions which are contacted by a metal silicide and has a second silicon gate electrode including a layer of titanium nitride. Interconnecting means including a layer of silicon with an overlaying layer of titanium nitride are provided for coupling the first and second gate electrodes.

DETAIL DESCRIPTION OF PREFERRED EMBODIMENTS

Figure 1:
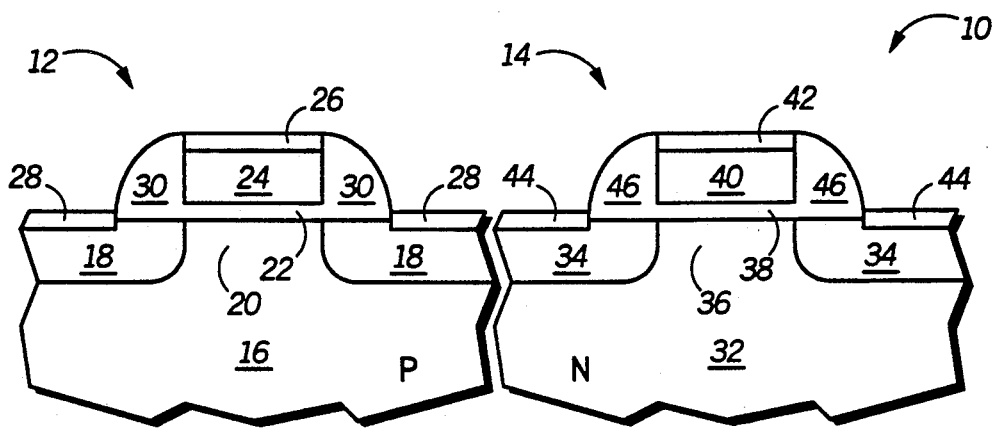
FIG. 1 illustrates, in cross section, a portion of a CMOS device in accordance with the invention.

FIG. 1 illustrates, in cross section, a portion 10 of a CMOS integrated circuit in accordance with the invention. Portion 10 of the integrated circuit includes an N channel MOS transistor 12 and a P channel MOS transistor 14. An actual integrated circuit would include many such devices properly interconnected to achieve the desired circuit function. N channel transistor 12 is formed in a P type surface region 16 of a monocrystalline silicon substrate. Formed in P type surface area 16 are N type source and drain regions 18 which are separated by a channel region 20. Overlaying channel region 20 is a gate insulator 22 and a silicon gate electrode 24. Gate electrode 24 may be polycrystalline or amorphous silicon, but for the purposes of this description will hereafter be referred to as a polycrystalline silicon gate electrode. Overlaying gate electrode 24, in accordance with the invention, is a layer 26 of an electrically conductive barrier layer 26 such as a layer of titanium nitride. Further in accordance with the invention, source and drain regions 18 are contacted by a metal silicide 28 which is spaced apart from gate electrode 24 by a sidewall spacer 30. In a similar manner, P channel MOS transistor 14 is fabricated in an N type surface area 32 and includes P type source and drain regions 34 separated by a channel region 36. Overlaying channel region 36 is a gate insulator 38 and a silicon gate electrode 40. In accordance with the invention, gate electrode 40 is overlaid by an electrically conductive barrier layer 42 such as a layer of titanium nitride. Further in accordance with the invention, source and drain regions 34 are contacted by a metal silicide 44 which is spaced apart from gate electrode 40 by a sidewall spacer 46.

Figure 2:
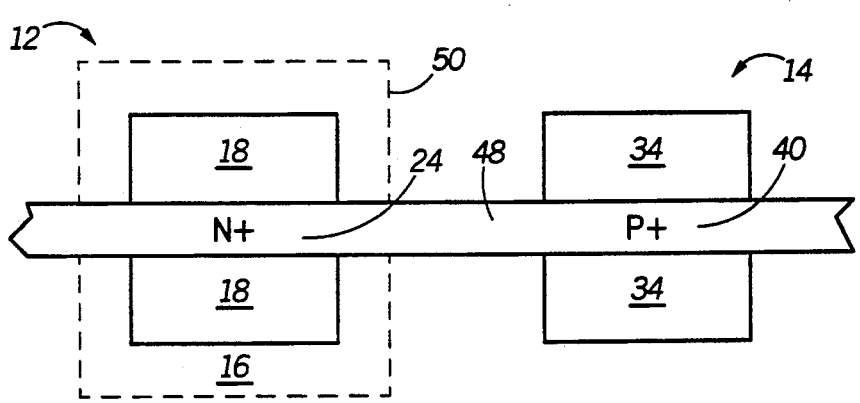
FIG. 2 illustrates schematically, in plan view, CMOS devices coupled together in accordance with the invention.

FIG. 2 illustrates schematically, in plan view, how two devices such as 12 and 14 are interconnected as part of the implementation of the circuit function. As illustrated, an N channel MOS transistor 12 is coupled to a P channel MOS transistor 14 by interconnection 48 which couples gate electrode 24 of device 12 to gate electrode 40 of device 14. In this embodiment, device 12 is fabricated in a P type well region 16 which is bounded by the dashed line 50. This embodiment thus illustrates a P well structure, but the invention is equally applicable to a N well structure or to a twin well structure. Gate electrode 24 of device 12 is heavily doped with N type impurities and gate electrode 40 is heavily doped with P type impurities. In accordance with the invention, gate electrodes 24 and 40, as well as interconnection 48, are covered by a layer of electrically conductive barrier material such as titanium nitride. On either side of gate electrode 24 are N type source and drain regions 18 and on either side of gate electrode 40 are P type source and drain regions 34. The titanium nitride or other electrically conductive barrier material reduces the resistivity of the gate electrodes and interconnection to values lower than can be achieved with doped polycrystalline silicon alone.

FIGS. 3-6 illustrate, in cross section, fabrication steps in accordance with one embodiment of the invention. In the process steps illustrated, a portion of an N channel MOS transistor such as transistor 12 is fabricated. Reference will be made to the additional steps necessary to also fabricate a P channel MOS transistor. Detailed description and illustration of these additional steps is not necessary for an understanding of the process in accordance with the invention.

Figure 3:
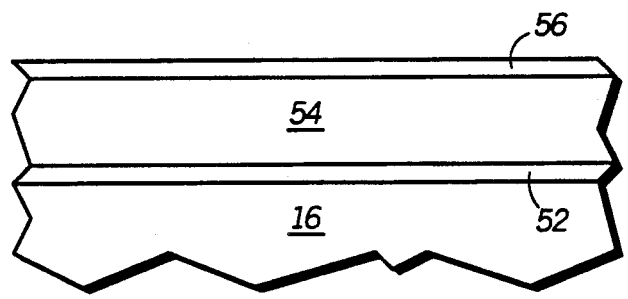
FIGS. 3-6 illustrate, in cross section, process steps in accordance with one embodiment of the invention.

As illustrated in FIG. 3, the process for fabricating the N channel MOS transistor portion of the CMOS integrated circuit begins with a silicon substrate having a P type surface area 16. Overlaying substrate 16 is a layer of gate insulator 52 which is preferably a layer of thermally grown silicon dioxide having a thickness of 10-30 nanometers. Overlaying gate insulator 32 is a layer of undoped polycrystalline silicon 54 and a layer of electrically conductive barrier material 56. Preferably polycrystalline silicon layer 54 is deposited by chemical vapor deposition to a thickness of about 200-400 nanometers. Barrier material 56 is preferably titanium nitride which is applied to the top surface of polycrystalline silicon layer 54 by reactive sputtering or by chemical vapor deposition. Barrier material 56, which will hereinafter be referred to as titanium nitride, has a thickness of about 30-200 nanometers.

Figure 4:
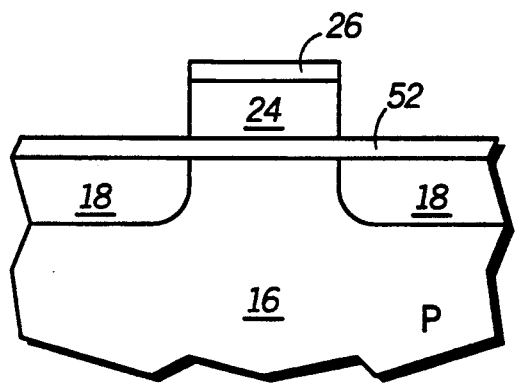

As illustrated in FIG. 4, the process continues by the patterning of polycrystalline silicon layer 54 and titanium nitride layer 56 to form a gate electrode 24 of polycrystalline silicon which is overlaid by titanium nitride barrier layer 26. The patterning of layers 54 and 56 is accomplished by conventional photolithography and etching. At the same time gate electrode 24 and overlaying titanium nitride layer 26 are patterned, gate electrodes of other devices used to implement the circuit as well as the interconnecting lines of polycrystalline silicon are also patterned. Thus the gate electrodes of P channel transistors and N channel transistors making up the circuit function are formed from undoped polycrystalline silicon overlaid by a barrier layer of titanium nitride. In addition, the same layers of polycrystalline silicon and titanium nitride are used to interconnect many of the devices on the circuit.

Source and drain regions 18 are next formed in P type surface area 16 by the selective introduction of N type dopants into the substrate using gate electrode 24 and titanium nitride layer 26 as dopant masks. Preferably the introduction of dopants is by the ion implantation of N type conductivity determining ions using photoresist to mask the P channel MOS transistors of the circuit during the ion implantation. Thus the N type dopants are introduced only into the source and drain regions of the N channel MOS transistors. In an additional step (not illustrated) P type dopant impurities are similarly introduced into the substrate, in a selective manner, to form the source and drain regions of the P channel MOS transistors being fabricated. During the introduction of these P type impurities into the P channel source and drain regions, the N channel transistors are protected from the introduction, for example by overlaying the N channel transistors with a patterned layer of photoresist.

The embodiment illustrated in FIGS. 3-6 depicts an LDD MOS structure in which a lightly doped drain region is self aligned with the gate electrode and subsequently a more heavily doped drain region is provided at a location spaced apart from the gate electrode. Optionally, but not illustrated, the devices can be made without the lightly doped drain structure and thus the source and drain regions 18 would be heavily doped with N type impurities. It is often the case that the LDD structure is used only on the N channel devices and the accompanying P channel devices are fabricated with a single, heavily doped drain region. Such a choice of drain structures is easily contemplated within the invention as the exact structure of the source and drain regions is not restricted by the invention itself.

Figure 5:
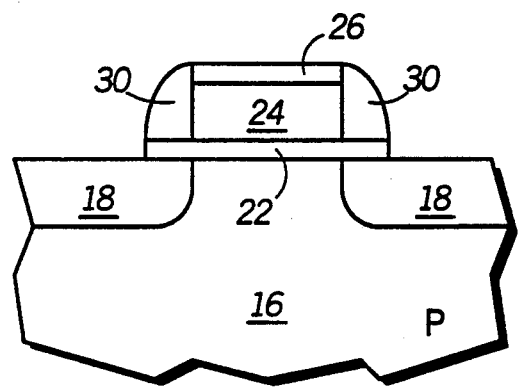
Figure 6:
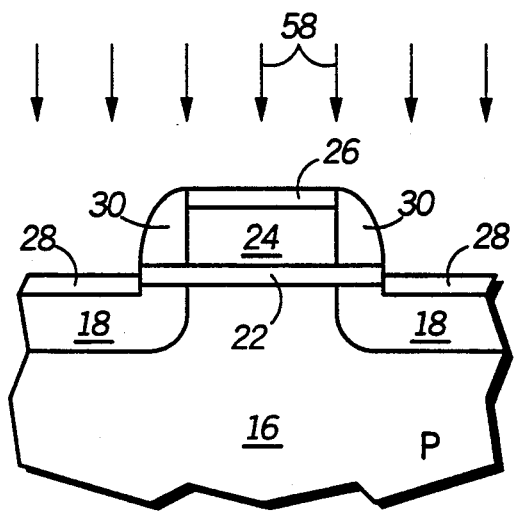

The process continues, as illustrated in FIG. 5, by the formation of sidewall spacers 30 at the edges of gate electrode 24. The sidewall spacers are formed from a material such as a low temperature oxide (LTO) or other material such as silicon nitride or the like. The spacer forming material is deposited over the gate electrode structure and is subsequently anisotropically etched, for example by reactive ion etching, to expose the barrier layer of titanium nitride. The anisotropic etching or a subsequent isotropic etching also removes the portion of dielectric layer 52 which is not protected by the sidewall spacers 30. The removal of this portion of the dielectric layer exposes a portion of the source and drain regions which is spaced apart from gate electrode 24. The remainder of dielectric layer 52, now labeled 22, forms the gate insulator of the device.

With the sidewall spacers in place, a layer of cobalt or other silicide forming metal is deposited over the structure to form a layer of cobalt silicide 28 or other metal silicide where the silicide forming metal contacts the silicon. The silicide thus forms over those exposed portions of source and drain regions 18 as well as over the source and drain regions of the associated P channel transistors. The silicide does not form over the titanium nitride nor does it form over the LTO spacers or other dielectric materials such as field insulators which are present in the structure. The unreacted cobalt is removed from the surface of the titanium nitride and other areas where no reaction occurred by etching in a metal etchant which does not also attack the titanium nitride or the silicide. For example, the unreacted cobalt is removed from the structure by etching in an etching solution which includes, in weight percent, 75% phosphoric acid, 2% nitric acid, 10% acetic acid, and balance water. The sidewall spacers 30 prevent the bridging or the formation of an electrical connection between the gate electrode and the associated source or drain region.

This portion of the fabrication process is completed by selectively doping the N channel device with a high concentration of N type conductivity determining impurity dopant. Preferably, arsenic or phosphorus ions are implanted into the gate electrode 24 and into silicide regions 28 while the P channel transistors of the circuit are protected by a layer of patterned photoresist. The implantation on the N type ions is indicated by arrows 58. The N type ions are introduced into the silicon gate electrode by ion implanting at an energy high enough to penetrate the overlaying layer of titanium nitride. The N type ions are at the same time implanted into or through the cobalt silicide. A subsequent thermal redistribution of the dopant impurities diffuses a high concentration of N type dopant impurities from the silicide into the underlaying P type surface region 16 to form a low resistivity contact between the cobalt silicide and the exposed portion of the source and drain regions which is spaced apart from gate electrode 24. In a similar impurity doping step, P type conductivity determining impurities are introduced into the P channel transistors of the integrated circuit while the N channel transistors are protected from such introduction by providing an overlaying mask, such as a layer of patterned photoresist.

The device is then completed, in conventional manner, by providing overlaying protective layers of insulators, additional interconnecting layers, and the like. The completed device includes a highly conductive gate electrode and a highly conductive interconnecting material, each comprised of a layer of doped polycrystalline silicon and an overlaying layer of an electrically conductive barrier material. The source and drain regions of each device are silicided by a metal silicide which provides high conductivity device regions with a low contact resistance. The interconnection is not silicided, and, therefore, the problem of accelerated diffusion of dopant impurities through silicided polycrystalline silicon is avoided.

In the above described embodiment of the invention, the silicon gate electrode is impurity doped by introducing the dopant through the overlaying layer of electrically conductive barrier material. This requires that the barrier layer be thin enough to allow the dopant impurities to pass through the barrier layer in sufficient quantity to adequately dope the underlaying silicon layer. If the overlaying barrier layer is made too thin, however, the resistivity of that layer increases and compromises the goal of reducing or minimizing the resistivity of the gate electrodes and interconnecting lines. This problem can be overcome, in accordance with an alternate embodiment of the invention (not illustrated), by selectively doping the layer of polycrystalline silicon 54, for example, by ion implantation with N type or P type conductivity determining ions, prior to the deposition of the overlaying layer of titanium nitride. The polycrystalline silicon on the N channel and P channel transistor regions are separately doped, for example, by masking the P channel transistors with photoresist during the ion implantation of the N channel transistors and by masking the N channel transistors with photoresist during the ion implantation of the P channel transistors. Following the selective doping of the polycrystalline silicon, titanium nitride or other barrier material is applied overlaying the polycrystalline silicon layer and the process proceeds as above.

In a still further embodiment of the invention, the resistivity of the polycrystalline silicon conductor is reduced by introducing titanium silicide beneath the layer of titanium nitride. The titanium silicide layer lowers the resistance of the gate electrode and the titanium nitride prevents the interaction between the titanium silicide with the layer of cobalt or other silicide forming metal. The layer of titanium silicide can be fabricated by depositing a layer of titanium having a thickness of about 20 nanometers overlaying the undoped polycrystalline silicon layer. This is followed by a rapid thermal anneal in a nitrogen or nitrogen containing ambient to convert the titanium to titanium silicide where the titanium is in contact with the polycrystalline silicon and to convert the top surface of the titanium to titanium nitride. The steps illustrated in FIGS. 4-6, above, are then performed.

Thus it is apparent that there has been provided, in accordance with the invention, a CMOS device and a process for its fabrication which fully meets the objects and advantages set forth above. Although the invention has been described and illustrated by reference to specific embodiments thereof, it is not intended that the invention be limited to these illustrative embodiments. Those skilled in the art will recognize that variations and modifications can be made without departing from the spirit of the invention. For example, other materials than titanium nitride can be used as the electrically conductive barrier layer. The barrier layer must be selected from materials which are sufficiently conductive to achieve the desired conductivity, which can withstand the subsequent processing, which are compatible with the silicide forming metal, and which are resistant to the etchant used to remove the unreacted silicide forming metal. In addition, other materials such as tungsten, tungsten silicide, tantalum silicide, and the like can be provided over the titanium nitride layer to further reduce the resistivity of the polycrystalline silicon interconnection. Other metal such as platinum or palladium can also be used to form the silicide, providing the silicide forming metal is compatible with the electrically conductive barrier material chosen. Accordingly, it is intended to encompass within the invention all such variations and modifications as fall within the scope of the appended claims.

We claim:
1. C CMOS device comprising:
   a first PMOS transistor having first source and drain regions contacted by a metal silicide and a first gate electrode including an electrically conductive barrier material overlying and in intimate contact with a layer of unsilicided silicon;
   a second NMOS transistor having second source and drain regions contacted by a metal silicide and a second gate electrode including an electrically conductive barrier material overlying and in intimate contact with a layer of unsilicided silicon;
   means comprising silicon and a layer of electrically conductive barrier material for coupling said first and second silicon gate electrodes.
2. The CMOS device of claim wherein said electrically conductive barrier material comprises titanium nitride.

3. The CMOS device of claim 2 wherein said first and second gate electrodes and said means comprising silicon comprise polycrystalline silicon.

4. The CMOS device of claim 2 wherein said first and second gate electrodes and said means comprising silicon comprise amorphous silicon.

5. The CMOS device of claim 1 wherein said first and second gate electrodes and said means comprising silicon comprise polycrystalline silicon.

6. The CMOS device of claim 3 wherein said first polycrystalline silicon gate electrode is doped with P-type conductivity determining impurities and said second polycrystalline silicon gate electrode is doped with N-type conductivity determining impurities.

7. The CMOS device of claim 6 wherein said first and second polycrystalline silicon gate electrodes further comprise a refractory metal or a metal silicide overlaying said titanium nitride.

8. The CMOS device of claim 1 wherein said first source and drain regions comprise a lightly doped P-type region aligned with said first gate electrode and a more heavily doped P-type region spaced apart from said first gate electrode and wherein said metal silicide contacts said more heavily doped P-type region.

9. The CMOS device of claim 1 wherein said second source and drain regions comprise a lightly doped N-type region aligned with said second gate electrode and a more heavily doped N-type region spaced apart from said second gate electrode and wherein said metal silicide contacts said more heavily doped N-type region.

10. The CMOS device of claim 2 wherein said metal silicide comprises cobalt silicide.

11. The CMOS device of claim 1 wherein said means comprising polycrystalline silicon is doped with conductivity determining impurities.

12. A CMOS device comprising:

a first PMOS transistor having a first unsilicided P-type polycrystalline silicon gate electrode overlaid by, and in intimate contact with, a layer of titanium nitride and having first source and drain regions formed on opposite sides of said first gate electrode, said first source and drain regions comprising P-type regions aligned with said first gate electrode and contacted by a metal silicide;

a second NMOS transistor having a second unsilicided N-type polycrystalline silicon gate electrode overlaid by, and in intimate contact with, a layer of titanium nitride and having second source and drain regions formed on opposite sides of said second unsilicided N-type polycrystalline silicon gate electrode, said second source and drain regions including a lightly doped N-type region aligned with said second unsilicided N-type polycrystalline silicon gate electrode and a more heavily doped N-type region spaced apart from said second unsilicided N-type polycrystalline silicon gate electrode, said more heavily doped N-type region contacted by a metal silicide; and means comprising unsilicided polycrystalline silicon overlaid by titanium nitride for coupling said first unsilicided P-type polycrystalline silicon gate electrode and said second unsilicided N-type polycrystalline silicon gate electrode, said unsilicided polycrystalline silicon extending from said unsilicided P-type polycrystalline silicon gate electrode to said unsilicided N-type polycrystalline silicon gate electrode, and said titanium nitride overlaying said unsilicided polycrystalline silicon being continuous from said titanium nitride overlaying said first gate electrode to said titanium nitride overlaying said second gate electrode.

13. The CMOS device of claim 12 wherein said metal silicide comprises cobalt silicide.

* * * * *

UNITED STATES PATENT AND TRADEMARK OFFICE
CERTIFICATE OF CORRECTION

PATENT NO. : 5,268,590
DATED : Dec. 7, 1993
INVENTOR(S) : James Ruhl Pfiester, Thomas C. Mele, Young Limb It is certified that error appears in the above-indentified patent and that said Letters Patent is hereby corrected as shown below:

In claim 1, Column 6, line 52
    change "C" to --A--

In claim 2, Column 6, line 66
    after "claim", add --1--

Signed and Sealed this

Twenty-third Day of August, 1994

Attest:

BRUCE LEHMAN

Attesting Officer     Commissioner of Patents and Trademarks